(12) United States Patent
Dimayuga et al.

(10) Patent No.: US 9,627,224 B2
(45) Date of Patent: Apr. 18, 2017

(54) SEMICONDUCTOR DEVICE WITH SLOPED SIDEWALL AND RELATED METHODS

(71) Applicant: STMICROELECTRONICS, INC., Calamba, Laguna (PH)

(72) Inventors: Godfrey Dimayuga, San Pablo (PH); Jefferson Talledo, Calamba (PH)

(73) Assignee: STMICROELECTRONICS, INC., Calamba (PH)

( * ) Notice: Subject to any disclaimer, the term of this patent is extended or adjusted under 35 U.S.C. 154(b) by 28 days.

(21) Appl. No.: 14/672,664

(22) Filed: Mar. 30, 2015

(65) Prior Publication Data

US 2016/0293450 A1 Oct. 6, 2016

(51) Int. Cl.
| | |
|---|---|
| *H01L 23/48* | (2006.01) |
| *H01L 21/48* | (2006.01) |
| *H01L 23/498* | (2006.01) |
| *H01L 23/13* | (2006.01) |
| *H01L 23/31* | (2006.01) |
| *H01L 23/00* | (2006.01) |

(52) U.S. Cl.
CPC ........ *H01L 21/486* (2013.01); *H01L 21/4857* (2013.01); *H01L 23/13* (2013.01); *H01L 23/49822* (2013.01); *H01L 23/49827* (2013.01); *H01L 23/49838* (2013.01); *H01L 23/3121* (2013.01); *H01L 23/3128* (2013.01); *H01L 24/29* (2013.01); *H01L 24/32* (2013.01); *H01L 24/45* (2013.01); *H01L 24/48* (2013.01); *H01L 24/73* (2013.01); *H01L 2224/04042* (2013.01); *H01L 2224/2919* (2013.01); *H01L 2224/32225* (2013.01); *H01L 2224/45144* (2013.01); *H01L 2224/48091* (2013.01); *H01L 2224/48228* (2013.01); *H01L 2224/73265* (2013.01); *H01L 2924/14* (2013.01); *H01L 2924/1434* (2013.01); *H01L 2924/15153* (2013.01); *H01L 2924/15311* (2013.01); *H01L 2924/15313* (2013.01)

(58) Field of Classification Search
CPC .................. H01L 23/5226; H01L 2924/01078
USPC .......................................... 257/774; 438/637
See application file for complete search history.

(56) References Cited

U.S. PATENT DOCUMENTS

| | | | | |
|---|---|---|---|---|
| 5,910,686 | A * | 6/1999 | Hamzehdoost | ......... H01L 23/13 257/706 |
| 6,340,894 | B1 * | 1/2002 | Farnworth | ........... G01R 1/0483 257/E21.525 |
| 8,558,386 | B2 | 10/2013 | Fjelstad et al. | |
| 9,269,867 | B2 * | 2/2016 | Kim | ........................ H01L 33/32 |

(Continued)

*Primary Examiner* — Jami M Valentine
(74) *Attorney, Agent, or Firm* — Seed Intellectual Property Law Group LLP

(57) ABSTRACT

A semiconductor device may include a multi-layer interconnect board having in stacked relation a lower conductive layer, a dielectric layer, and an upper conductive layer. The dielectric layer may have a recess formed with a bottom and sloping sidewall extending upwardly from the bottom. The upper conductive layer may include upper conductive traces extending across the sloping sidewall, and the lower conductive layer may include lower conductive traces. The semiconductor device may include vias extending between the lower and upper conductive layers, an IC carried by the multi-layer interconnect board in the recess, bond wires coupling upper conductive traces to the IC, and encapsulation material adjacent the IC and adjacent portions of the multi-layer interconnect board.

33 Claims, 3 Drawing Sheets

(56) References Cited

U.S. PATENT DOCUMENTS

| | | | | |
|---|---|---|---|---|
| 2001/0012639 A1* | 8/2001 | Akram | ............... | G01K 1/026 |
| | | | | 438/18 |
| 2003/0059960 A1* | 3/2003 | Akram | ............... | G01K 1/026 |
| | | | | 438/5 |
| 2003/0202330 A1* | 10/2003 | Lopata | ........... | H01L 23/49805 |
| | | | | 361/760 |
| 2006/0151880 A1* | 7/2006 | Tang | ............ | H01L 24/03 |
| | | | | 257/751 |
| 2007/0080360 A1* | 4/2007 | Mirsky | ........... | H01L 23/3677 |
| | | | | 257/99 |
| 2010/0144139 A1* | 6/2010 | Wood | ............ | H01L 21/4885 |
| | | | | 438/666 |
| 2012/0126399 A1* | 5/2012 | Lin | ............ | H01L 21/56 |
| | | | | 257/737 |
| 2012/0129299 A1* | 5/2012 | Lin | ............ | H01L 21/4878 |
| | | | | 438/118 |
| 2012/0273963 A1* | 11/2012 | Mirsky | ........... | H01L 23/3735 |
| | | | | 257/774 |

* cited by examiner

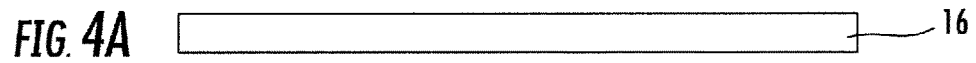
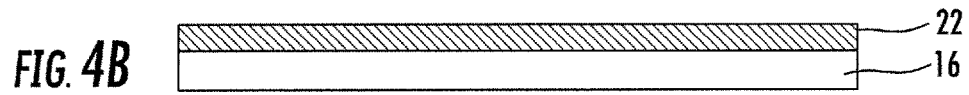
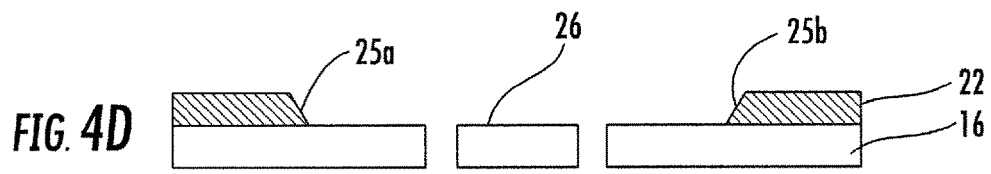
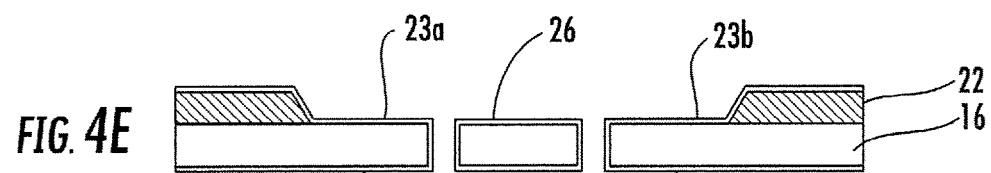
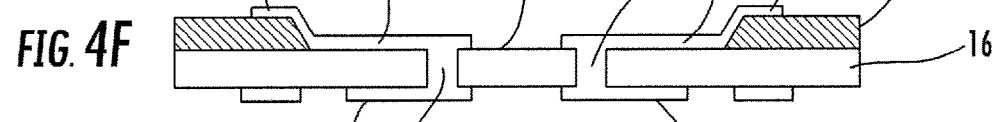
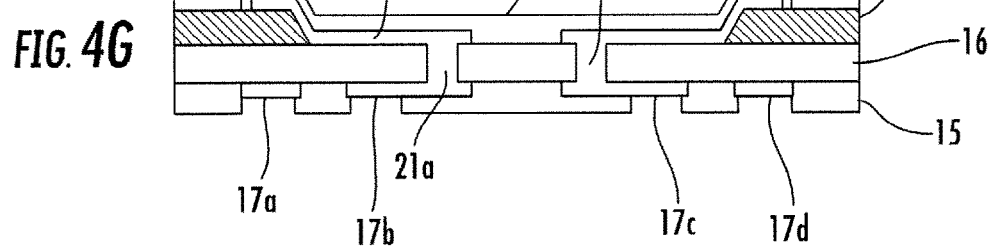

US 9,627,224 B2

SEMICONDUCTOR DEVICE WITH SLOPED SIDEWALL AND RELATED METHODS

TECHNICAL FIELD

The present disclosure relates to the field of electronic devices, and, more particularly, to semiconductor devices and related methods.

BACKGROUND

In electronic devices with integrated circuits (ICs), the ICs are typically mounted onto circuit boards. In order to electrically couple connections between the circuit board and the IC, the IC is typically "packaged." The IC packaging usually provides a small encasement for physically protecting the IC and provides contact pads for coupling to the circuit board. In some applications, the packaged IC may be coupled to the circuit board via solder bumps.

One approach to IC packaging comprises a packaged organic laminate substrate device. Referring to FIG. 1, a typical semiconductor device 100 is now described. The semiconductor device 100 includes first and second mask layers 104, 105, a core layer 106 between the first and second mask layers, and contacts 107a-107d carried by the core layer. The semiconductor device 100 includes contact pads 108a-108b also carried by the core layer 106, an IC 103, an adhesive layer 109 between the IC and the first mask layer 104, and bond wires 102a-102b coupling the contact pads and the IC. The semiconductor device 100 includes encapsulation material 101 over the IC 103 and the first mask layer 104.

Referring now to FIG. 2, another typical semiconductor device 200 is now described. The semiconductor device 200 includes a mask layer 204, and a core layer 206 under the mask layer. The core and mask layers 206, 204 define a recess. The semiconductor device 200 includes contact pads 208a-208b also carried by the core layer 206, an IC 203 in the recess, and bond wires 202a-202b coupling the contact pads and the IC. The semiconductor device 200 includes encapsulation material 201 over the IC 203 and the mask layer 204, and ball grid array contacts 209a-209b on the mask layer 204.

SUMMARY

Generally speaking, a semiconductor device may comprise a multi-layer interconnect board comprising in stacked relation a lower conductive layer, at least one dielectric layer, and an upper conductive layer. The at least one dielectric layer may have a recess formed therein with a bottom and sloping sidewall extending upwardly from the bottom, and the upper conductive layer may have a plurality of upper conductive traces extending across the sloping sidewall. The lower conductive layer may comprise a plurality of lower conductive traces. The semiconductor device may comprise a plurality of vias extending between the lower and upper conductive layers, at least one IC carried by the multi-layer interconnect board in the recess, a plurality of bond wires coupling upper conductive traces to the at least one IC, and encapsulation material adjacent the at least one IC and adjacent portions of the multi-layer interconnect board.

In particular, the plurality of upper conductive traces may each have a pair of adjacent bends therein to thereby conform to the sloping sidewall. The multi-layer interconnect board may comprise a lower dielectric mask layer adjacent the lower conductive layer, and an upper dielectric mask layer adjacent the upper conductive layer. The lower dielectric mask layer may define a plurality of lower openings, and the lower conductive layer may comprise a plurality of contacts coupled to the plurality of lower conductive traces and accessible through the plurality of lower openings. Also, the upper dielectric mask layer may define a plurality of upper openings, and the upper conductive layer may comprise a plurality of contact pads coupled to the plurality of upper conductive traces and accessible through the plurality of upper openings.

In some embodiments, the at least one dielectric layer may comprise upper and lower dielectric layers bonded together. The upper dielectric layer may be ring-shaped with an opening therein defining the recess. For example, the sloping sidewall may have an inclined angle in a range of 30 to 60 degrees. The at least one IC may comprise a plurality of bond pads on an upper surface thereof coupled to respective ones of the plurality of upper conductive traces.

Another aspect is directed to a method for making a semiconductor device. The method may include forming a multi-layer interconnect board comprising in stacked relation a lower conductive layer, at least one dielectric layer, and an upper conductive layer. The at least one dielectric layer may have a recess formed therein with a bottom and sloping sidewall extending upwardly from the bottom. The upper conductive layer may comprise a plurality of upper conductive traces extending across the sloping sidewall, and the lower conductive layer may comprise a plurality of lower conductive traces. The method may include forming a plurality of vias extending between the lower and upper conductive layers, coupling at least one IC in the recess of the multi-layer interconnect board, coupling a plurality of bond wires between upper conductive traces and the at least one IC, and forming encapsulation material adjacent the at least one IC and adjacent portions of the multi-layer interconnect board.

BRIEF DESCRIPTION OF THE DRAWINGS

FIGS. 4A-4G are schematic cross-section views of the semiconductor device from FIG. 3A during manufacturing.

DETAILED DESCRIPTION

The present disclosure will now be described more fully hereinafter with reference to the accompanying drawings, in which several embodiments of the present disclosure are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

Figure 3A:
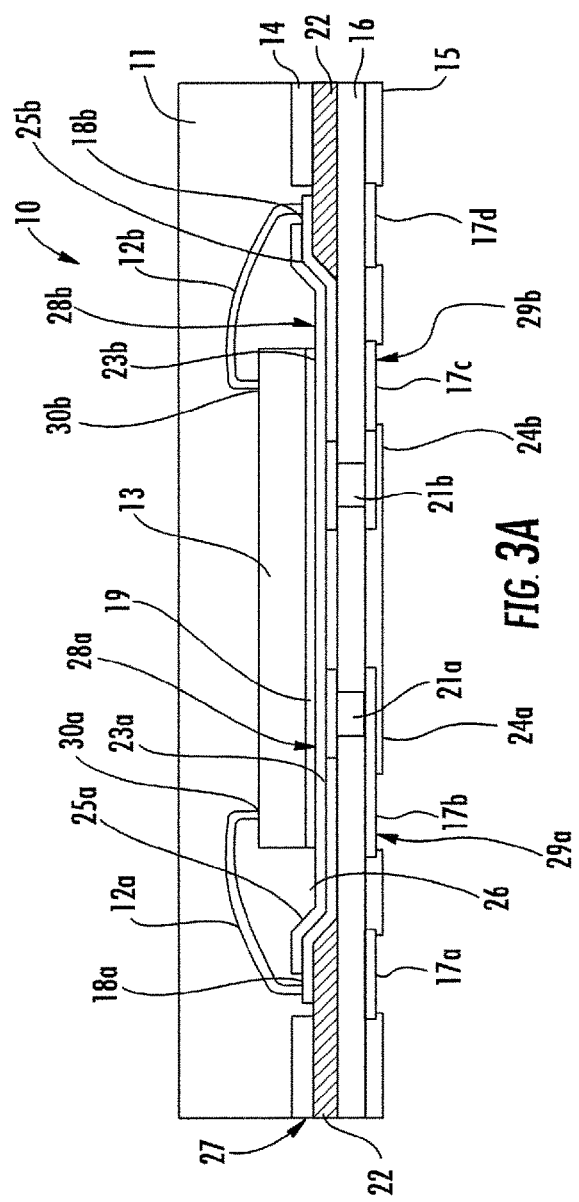
FIG. 3A is a schematic cross-section view of a semiconductor device, according to the present disclosure.
Figure 3B:
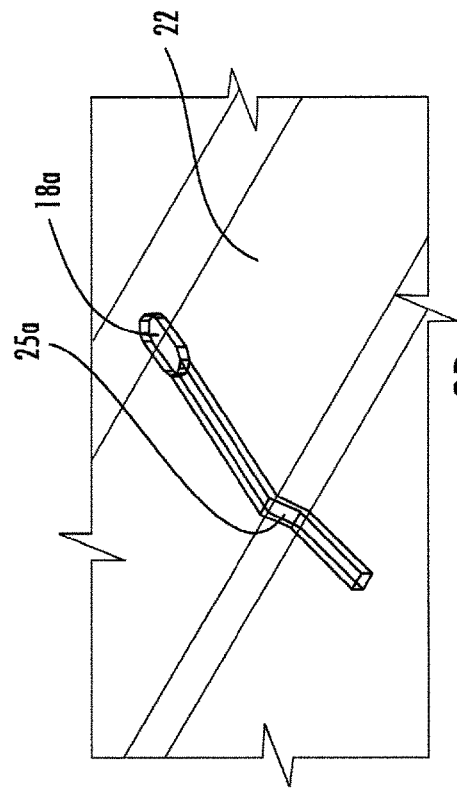
FIG. 3B is a schematic perspective view of a portion of the semiconductor device from FIG. 3A.

Referring now to FIGS. 3A-3B, a semiconductor device 10 according to the present disclosure is now described. The semiconductor device 10 illustratively includes a multi-layer interconnect board 27 comprising in stacked relation a lower dielectric mask layer 15, a lower conductive layer (e.g. copper, aluminum) 29a-29b, upper and lower dielectric layers 22, 16 bonded together, an upper conductive layer (e.g. copper, aluminum) 28a-28b, and an upper dielectric mask layer 14 adjacent the upper conductive layer. In some embodiments, the upper and lower dielectric layers 22, 16 may comprise a single dielectric layer. The upper and lower dielectric layers 22, 16 may comprise pre-impregnated (prepreg) circuit board layers.

The upper and lower dielectric layers 22, 16 have a recess 26 formed therein with a bottom and sloping sidewall 25a-25b extending upwardly from the bottom. For example, the sloping sidewall 25a-25b may have an inclined angle in a range of 30 to 60 degrees. The upper dielectric layer 22 is illustratively ring-shaped with an opening or inner edge therein defining the recess 26. The opening may be rectangle-shaped, or square-shaped.

The upper conductive layer 28a-28b has a plurality of upper conductive traces 23a-23b extending across the sloping sidewall 25a-25b, and a plurality of contact pads 18a-18b coupled to the plurality of upper conductive traces. In particular, the plurality of upper conductive traces 23a-23b each has a pair of adjacent bends therein to thereby conform to the sloping sidewall 25a-25b. In other words, the plurality of upper conductive traces 23a-23b is canted vertically along the sloping sidewall 25a-25b.

The lower conductive layer 29a-29b comprises a plurality of lower conductive traces 24a-24b, and a plurality of contacts 17a-17d (e.g. the illustrated land grid array contacts, or ball grid array contacts) coupled to the plurality of lower conductive traces. The semiconductor device 10 comprises a plurality of vias (e.g. copper, aluminum) 21a-21b extending between the lower and upper conductive layers 29a-29b, 28a-28b.

The lower dielectric mask layer 15 defines a plurality of lower openings, and the plurality of contacts 17a-17d is accessible through the plurality of lower openings. Also, the upper dielectric mask layer 14 defines a plurality of upper openings, and the plurality of contact pads 18a-18b is accessible through the plurality of upper openings.

The semiconductor device 10 illustratively includes an IC 13 (e.g. system-on-chip, processor, memory) carried by the multi-layer interconnect board 27 in the recess 26, and an adhesive layer 19 between the IC and the multi-layer interconnect board. The IC 13 may comprise a plurality of bond pads 30a-30b on an upper surface thereof coupled to respective ones of the plurality of upper conductive traces 23a-23b. In some embodiments, the IC 13 may comprise a plurality thereof.

The semiconductor device 10 illustratively includes plurality of bond wires (e.g. gold) 12a-12b coupling upper conductive traces 23a-23b to the IC 13. The semiconductor device 10 illustratively includes encapsulation material 11 adjacent the IC 13 and adjacent portions of the multi-layer interconnect board 27.

Referring now to FIGS. 4A-4G, another aspect is directed to a method for making a semiconductor device 10. The method may include forming a multi-layer interconnect board 27 comprising in stacked relation a lower conductive layer 29a-29b, upper and lower dielectric layers 22, 16, and an upper conductive layer 28a-28b. The upper and lower dielectric layers 22, 16 may have a recess 26 formed therein with a bottom and sloping sidewall 25a-25b extending upwardly from the bottom. The upper conductive layer 28a-28b may comprise a plurality of upper conductive traces 23a-23b extending across the sloping sidewall 25a-25b, and the lower conductive layer 29a-29b may comprise a plurality of lower conductive traces 24a-24b. The method may include forming a plurality of vias 21a-21b extending between the lower and upper conductive layers 29a-29b, 28a-28b, coupling an IC 13 in the recess 26 of the multi-layer interconnect board 27, coupling a plurality of bond wires 12a-12b between upper conductive traces 23a-23b and the IC, and forming encapsulation material 11 adjacent the IC and adjacent portions of the multi-layer interconnect board.

In particular, in FIG. 4B, the upper and lower dielectric layers 22, 16 are bonded together using a prepreg lamination process. In FIG. 4C, the upper dielectric layer 22 is formed using laser ablation or chemical etching, for example, and in FIG. 4D, the openings for the vias 21a-21b are formed using mechanical or laser based drilling processes. In FIG. 4E, a thin conductive layer is formed on the bonded together upper and lower dielectric layers 22, 16, and a selective etching is then performed. In FIG. 4F, the conductive material is now plated selectively onto the prior thin layer. In FIG. 4G, the upper and lower dielectric mask layer 14, 15 are formed, and a Nickel-Gold plating step is performed.

Figure 1:
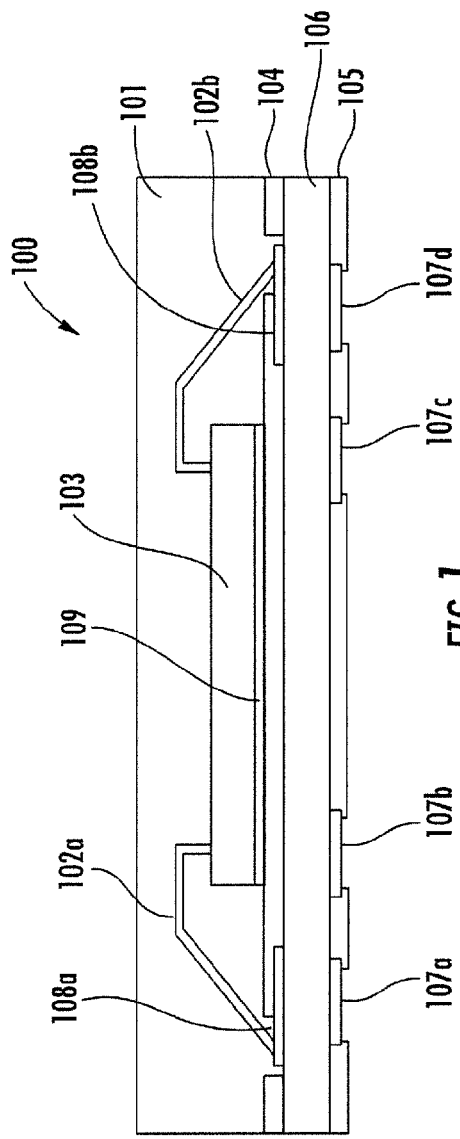
FIG. 1 is a schematic cross-section view of a semiconductor device, according to the prior art.
Figure 2:
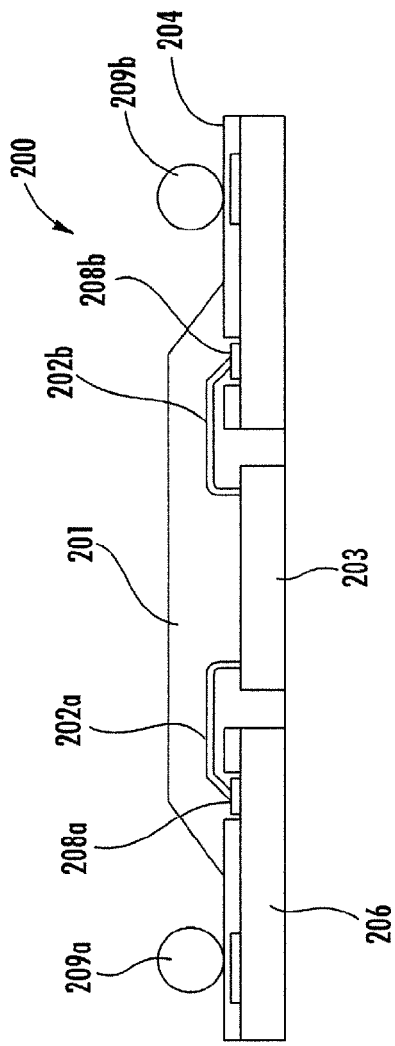
FIG. 2 is a schematic cross-section view of another semiconductor device, according to the prior art.

Advantageously, the semiconductor device 10 may provide several benefits over the prior art approaches of FIGS. 1-2. In particular, the semiconductor device 10 has a reduced overall thickness and profile height. This enables the semiconductor device 10 to be used in space limited applications, such as mobile devices. Also, the semiconductor device 10 reduces the risk of the adhesive layer 19 bleeding out from under the IC 13 and damaging the plurality of bond wires 12a-12b (See, e.g., FIG. 1). Moreover, the semiconductor device 10 provides design flexibility with trace routing on the recess 26 (i.e. the upper conductive traces 23a-23b can be routed within the recess) and enabling smaller spacing between the IC 13 and the plurality of bond wires 12a-12b, in contrast to the prior approach of FIG. 2.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A semiconductor device comprising:
   a multi-layer interconnect board comprising in stacked relation a lower conductive layer, at least one dielectric layer, and an upper conductive layer;
   said at least one dielectric layer having a recess formed therein with a bottom and sloping sidewall extending upwardly from the bottom, the sloping sidewall having an oblique angle with respect to the bottom of the recess;
   said at least one dielectric layer comprising upper and lower dielectric layers bonded together, said upper dielectric layer being ring-shaped with an opening therein also defining the recess;
   said upper conductive layer comprising a plurality of upper conductive traces extending across the sloping sidewall;
   said lower conductive layer comprising a plurality of lower conductive traces;
   a plurality of vias extending between said lower and upper conductive layers;
   at least one integrated circuit (IC) carried by said multi-layer interconnect board in the recess;

a plurality of bond wires coupling upper conductive traces to said at least one IC; and encapsulation material adjacent said at least one IC and adjacent portions of said multi-layer interconnect board.

2. The semiconductor device of claim 1 wherein said plurality of upper conductive traces each has a pair of adjacent bends therein to thereby conform to the sloping sidewall.

3. The semiconductor device of claim 1 wherein said multi-layer interconnect board comprises a lower dielectric mask layer adjacent said lower conductive layer, and an upper dielectric mask layer adjacent said upper conductive layer.

4. The semiconductor device of claim 3 wherein said lower dielectric mask layer defines a plurality of lower openings; and wherein said lower conductive layer comprises a plurality of contacts coupled to said plurality of lower conductive traces and accessible through the plurality of lower openings.

5. The semiconductor device of claim 3 wherein said upper dielectric mask layer defines a plurality of upper openings; and wherein said upper conductive layer comprises a plurality of contact pads coupled to said plurality of upper conductive traces and accessible through the plurality of upper openings.

6. The semiconductor device of claim 1 wherein the sloping sidewall has an inclined angle in a range of 30 to 60 degrees.

7. The semiconductor device of claim 1 wherein said at least one IC comprises a plurality of bond pads on an upper surface thereof coupled to respective ones of said plurality of upper conductive traces.

8. A semiconductor device comprising:
a multi-layer interconnect board comprising in stacked relation
a lower dielectric mask layer,
a lower conductive layer,
at least one dielectric layer,
an upper conductive layer, and
an upper dielectric mask layer;
said at least one dielectric layer having a recess formed therein with a bottom and sloping sidewall extending upwardly from the bottom;
said upper conductive layer comprising a plurality of upper conductive traces extending across the sloping sidewall, said plurality of upper conductive traces each having a pair of adjacent bends therein to thereby conform to the sloping sidewall;
said lower conductive layer comprising a plurality of lower conductive traces;
a plurality of vias extending between said lower and upper conductive layers;
at least one integrated circuit (IC) carried by said multi-layer interconnect board in the recess;
a plurality of bond wires coupling upper conductive traces to said at least one IC; and
encapsulation material adjacent said at least one IC and adjacent portions of said multi-layer interconnect board.

9. The semiconductor device of claim 8 wherein said lower dielectric mask layer defines a plurality of lower openings; and wherein said lower conductive layer comprises a plurality of contacts coupled to said plurality of lower conductive traces and accessible through the plurality of lower openings.

10. The semiconductor device of claim 8 wherein said upper dielectric mask layer defines a plurality of upper openings; and wherein said upper conductive layer comprises a plurality of contact pads coupled to said plurality of upper conductive traces and accessible through the plurality of upper openings.

11. The semiconductor device of claim 8 wherein said at least one dielectric layer comprises upper and lower dielectric layers bonded together.

12. The semiconductor device of claim 11 wherein said upper dielectric layer is ring-shaped with an opening therein defining the recess.

13. The semiconductor device of claim 8 wherein the sloping sidewall has an inclined angle in a range of 30 to 60 degrees.

14. A method for making a semiconductor device comprising:
forming a multi-layer interconnect board comprising in stacked relation a lower conductive layer, at least one dielectric layer, and an upper conductive layer, the at least one dielectric layer having a recess formed therein with a bottom and sloping sidewall extending upwardly from the bottom, the sloping sidewall having an oblique angle with respect to the bottom of the recess, the at least one dielectric layer comprising upper and lower dielectric layers bonded together, the upper dielectric layer being ring-shaped with an opening therein also defining the recess, the upper conductive layer comprising a plurality of upper conductive traces extending across the sloping sidewall, the lower conductive layer comprising a plurality of lower conductive traces;
forming a plurality of vias extending between the lower and upper conductive layers;
coupling at least one integrated circuit (IC) in the recess of the multi-layer interconnect board;
coupling a plurality of bond wires between upper conductive traces and the at least one IC; and
forming encapsulation material adjacent the at least one IC and adjacent portions of the multi-layer interconnect board.

15. The method of claim 14 wherein the plurality of upper conductive traces each has a pair of adjacent bends therein to thereby conform to the sloping sidewall.

16. The method of claim 14 wherein the multi-layer interconnect board comprises a lower dielectric mask layer adjacent the lower conductive layer, and an upper dielectric mask layer adjacent the upper conductive layer.

17. The method of claim 16 wherein the lower dielectric mask layer defines a plurality of lower openings; and wherein the lower conductive layer comprises a plurality of contacts coupled to the plurality of lower conductive traces and accessible through the plurality of lower openings.

18. The method of claim 16 wherein the upper dielectric mask layer defines a plurality of upper openings; and wherein the upper conductive layer comprises a plurality of contact pads coupled to the plurality of upper conductive traces and accessible through the plurality of upper openings.

19. A semiconductor device comprising:
a multi-layer interconnect board comprising in stacked relation a lower conductive layer, at least one dielectric layer, and an upper conductive layer;
said at least one dielectric layer having a recess formed therein with a bottom and sloping sidewall extending upwardly from the bottom;

said at least one dielectric layer comprising upper and lower dielectric layers bonded together, said upper dielectric layer being ring-shaped with an opening therein also defining the recess;

said upper conductive layer comprising a plurality of upper conductive traces extending across the sloping sidewall;

said lower conductive layer comprising a plurality of lower conductive traces;

a plurality of vias extending between said lower and upper conductive layers;

at least one integrated circuit (IC) carried by said multi-layer interconnect board in the recess;

a plurality of bond wires coupling upper conductive traces to said at least one IC; and encapsulation material adjacent said at least one IC and adjacent portions of said multi-layer interconnect board.

20. The semiconductor device of claim 19 wherein said plurality of upper conductive traces each has a pair of adjacent bends therein to thereby conform to the sloping sidewall.

21. The semiconductor device of claim 19 wherein said multi-layer interconnect board comprises a lower dielectric mask layer adjacent said lower conductive layer, and an upper dielectric mask layer adjacent said upper conductive layer.

22. A semiconductor device comprising:
a multi-layer interconnect board comprising in stacked relation a lower conductive layer, at least one dielectric layer, and an upper conductive layer;

said at least one dielectric layer having a recess formed therein with a bottom and sloping sidewall extending upwardly from the bottom, the sloping sidewall having an oblique angle with respect to the bottom of the recess;

said upper conductive layer comprising a plurality of upper conductive traces extending across the sloping sidewall, said plurality of upper conductive traces each having a pair of adjacent bends therein to thereby conform to the sloping sidewall;

said lower conductive layer comprising a plurality of lower conductive traces;

a plurality of vias extending between said lower and upper conductive layers;

at least one integrated circuit (IC) carried by said multi-layer interconnect board in the recess;

a plurality of bond wires coupling upper conductive traces to said at least one IC; and encapsulation material adjacent said at least one IC and adjacent portions of said multi-layer interconnect board.

23. The semiconductor device of claim 22 wherein the sloping sidewall has an inclined angle in a range of 30 to 60 degrees.

24. The semiconductor device of claim 22 wherein said at least one IC comprises a plurality of bond pads on an upper surface thereof coupled to respective ones of said plurality of upper conductive traces.

25. A semiconductor device comprising:
a multi-layer interconnect board comprising in stacked relation
a lower dielectric mask layer,
a lower conductive layer,
at least one dielectric layer,
an upper conductive layer, and
an upper dielectric mask layer;

said at least one dielectric layer having a recess formed therein with a bottom and sloping sidewall extending upwardly from the bottom, the sloping sidewall having an oblique angle with respect to the bottom of the recess;

said upper conductive layer comprising a plurality of upper conductive traces extending across the sloping sidewall;

said lower conductive layer comprising a plurality of lower conductive traces;

a plurality of vias extending between said lower and upper conductive layers;

at least one integrated circuit (IC) carried by said multi-layer interconnect board in the recess;

a plurality of bond wires coupling upper conductive traces to said at least one IC; and encapsulation material adjacent said at least one IC and adjacent portions of said multi-layer interconnect board.

26. The semiconductor device of claim 25 wherein the sloping sidewall has an inclined angle in a range of 30 to 60 degrees.

27. The semiconductor device of claim 25 wherein said at least one IC comprises a plurality of bond pads on an upper surface thereof coupled to respective ones of said plurality of upper conductive traces.

28. A method for making a semiconductor device comprising:
forming a multi-layer interconnect board comprising in stacked relation a lower conductive layer, at least one dielectric layer, and an upper conductive layer, the at least one dielectric layer having a recess formed therein with a bottom and sloping sidewall extending upwardly from the bottom, the sloping sidewall having an oblique angle with respect to the bottom of the recess, the upper conductive layer comprising a plurality of upper conductive traces extending across the sloping sidewall, the plurality of upper conductive traces each having a pair of adjacent bends therein to thereby conform to the sloping sidewall, the lower conductive layer comprising a plurality of lower conductive traces;

forming a plurality of vias extending between the lower and upper conductive layers;

coupling at least one integrated circuit (IC) in the recess of the multi-layer interconnect board;

coupling a plurality of bond wires between upper conductive traces and the at least one IC; and forming encapsulation material adjacent the at least one IC and adjacent portions of the multi-layer interconnect board.

29. The method of claim 28 wherein the sloping sidewall has an inclined angle in a range of 30 to 60 degrees.

30. The method of claim 28 wherein the at least one IC comprises a plurality of bond pads on an upper surface thereof coupled to respective ones of the plurality of upper conductive traces.

31. A method for making a semiconductor device comprising:
forming a multi-layer interconnect board comprising in stacked relation a lower dielectric mask layer, a lower conductive layer, at least one dielectric layer, an upper conductive layer, and an upper dielectric mask layer, the at least one dielectric layer having a recess formed therein with a bottom and sloping sidewall extending upwardly from the bottom, the sloping sidewall having an oblique angle with respect to the bottom of the recess, the upper conductive layer comprising a plurality of upper conductive traces extending across the sloping sidewall, the lower conductive layer comprising a plurality of lower conductive traces;

forming a plurality of vias extending between the lower and upper conductive layers;

coupling at least one integrated circuit (IC) in the recess of the multi-layer interconnect board;

coupling a plurality of bond wires between upper conductive traces and the at least one IC; and forming encapsulation material adjacent the at least one IC and adjacent portions of the multi-layer interconnect board.

32. The method of claim 31 wherein the sloping sidewall has an inclined angle in a range of 30 to 60 degrees.

33. The method of claim 31 wherein the at least one IC comprises a plurality of bond pads on an upper surface thereof coupled to respective ones of the plurality of upper conductive traces.

\* \* \* \* \*